United States Patent
Li et al.

(10) Patent No.: US 10,241,356 B2
(45) Date of Patent: Mar. 26, 2019

(54) DISPLAY DEVICE

(71) Applicants: BOE Technology Group Co., Ltd., Beijing (CN); Beijing BOE Optoelectronics Technology Co., Ltd., Beijing (CN)

(72) Inventors: Pei Li, Beijing (CN); Tingting Zhao, Beijing (CN); Qian Wang, Beijing (CN); Yu Zhou, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/508,583

(22) PCT Filed: Aug. 12, 2016

(86) PCT No.: PCT/CN2016/094989
§ 371 (c)(1),
(2) Date: Mar. 3, 2017

(87) PCT Pub. No.: WO2017/067301
PCT Pub. Date: Apr. 27, 2017

(65) Prior Publication Data
US 2017/0276979 A1 Sep. 28, 2017

(30) Foreign Application Priority Data
Oct. 21, 2015 (CN) .......................... 2015 1 0689434

(51) Int. Cl.
*G02F 1/1333* (2006.01)
*B65D 65/42* (2006.01)
(Continued)

(52) U.S. Cl.
CPC .......... *G02F 1/1333* (2013.01); *B65D 65/42* (2013.01); *C09K 3/1445* (2013.01);
(Continued)

(58) Field of Classification Search
CPC .......................... G02F 1/1333; H01L 51/0024
See application file for complete search history.

(56) References Cited

U.S. PATENT DOCUMENTS

2014/0333852 A1* 11/2014 Ishikawa ............. G02F 1/13338
349/12
2015/0049263 A1  2/2015 Chu et al.
2015/0103267 A1  4/2015 Zhang et al.

FOREIGN PATENT DOCUMENTS

CN    101087490 A   12/2007
CN    102573253 A    7/2012
(Continued)

OTHER PUBLICATIONS

Nov. 7, 2016—(WO) International Search Report and Written Opinion Appn PCT/CN2016/094989 with English Tran.
(Continued)

*Primary Examiner* — Anne M Hines
(74) *Attorney, Agent, or Firm* — Banner & Witcoff, Ltd.

(57) ABSTRACT

A display device comprises a display panel and a cover plate stacked with the display panel. An antistatic layer is provided on a side of the cover plate facing toward the display panel. The antistatic layer surrounds a display region (AA) of the display device, and the antistatic layer is grounded. The display device can achieve the antistatic protection function without reducing the light transmittance while meeting the requirement of the narrow bezel display device.

20 Claims, 3 Drawing Sheets

(51) Int. Cl.
  *C09K 3/14* (2006.01)
  *G03C 1/85* (2006.01)
  *H01L 51/00* (2006.01)
  *H01L 51/42* (2006.01)
  *G02F 1/1362* (2006.01)
  *H01L 27/02* (2006.01)
  *H04M 1/02* (2006.01)
  *H01L 27/32* (2006.01)
  *G02F 1/1345* (2006.01)

(52) U.S. Cl.
  CPC ....... *G02F 1/136204* (2013.01); *G03C 1/853* (2013.01); *H01L 27/0248* (2013.01); *H01L 27/3276* (2013.01); *H01L 51/0024* (2013.01); *H01L 51/4206* (2013.01); *H04M 1/0266* (2013.01); *G02F 1/1345* (2013.01); *G02F 2202/28* (2013.01)

(56) References Cited

FOREIGN PATENT DOCUMENTS

| | | |
|---|---|---|
| CN | 103500044 A | 1/2014 |
| CN | 103576971 A | 2/2014 |
| CN | 104090677 A | 10/2014 |
| CN | 104375689 A | 2/2015 |
| CN | 104698636 A | 6/2015 |
| CN | 105319751 A | 2/2016 |
| CN | 205038423 U | 2/2016 |
| JP | 2006139100 A | 6/2006 |

OTHER PUBLICATIONS

Nov. 28, 2017—(CN) First Office Action Appn 201510689434.1 with English Tran.

* cited by examiner

DISPLAY DEVICE

The application is a U.S. National Phase Entry of International Application No. PCT/CN2016/094989 filed on Aug. 12, 2016, designating the United States of America and claiming priority to Chinese Patent Application No. 201510689434.1 filed on Oct. 21, 2015. The present application claims priority to and the benefit of the above-identified applications and the above-identified applications are incorporated by reference herein in their entirety.

TECHNICAL FIELD

Embodiments of the present disclosure relate to a display device.

BACKGROUND

During production and use of a display device, static electricity will be generated at the inside thereof. The generated static electricity will be accumulated in the display device if not released in time. When the static electricity is accumulated into a certain amount, an instantaneous discharge will occur and a high current will be generated, which is an ESD (Electro Static Discharge) phenomenon. The ESD phenomenon may cause a burnout of integrated circuits or internal wirings of the display device, as a result of which the display device fails to work normally. Therefore, it is necessary to provide an antistatic protection for the display device.

At present, a common antistatic protection is as follows. An antistatic layer made of ITO material is disposed on a color filter substrate or a polarizer of the display device. A transparent cover plate is disposed on the antistatic layer so as to protect the antistatic layer. The antistatic layer and a grounding pad provided on an array substrate of the display device are electrically connected to each other so that the generated static electricity is led to the grounding pad through the antistatic layer. However, in such an arrangement, since the antistatic layer covers the display region and the antistatic layer made of ITO material has a refractive index different from that of the base substrate made of glass in the display device, a refraction of light will occur when the light passes through the antistatic layer, which leads to a loss of light and a reduction of light transmittance.

Another antistatic protection of the conventional art is such that an antistatic ring surrounding the display region is disposed on the color filter substrate. To ensure the charge transport performance of the antistatic ring, the antistatic ring is required to have a certain line width. However, in a display device with narrow bezel, the edge of the color filter substrate has a very narrow region in which the antistatic ring can be disposed, so that it is not allowed to provide an antistatic ring having a good charge transport performance.

SUMMARY

At least one embodiment of the present disclosure provides a display device, comprising a display panel and a cover plate stacked with the display panel, an antistatic layer is provided on a side of the cover plate facing toward the display panel, the antistatic layer surrounds a display region of the display device, and the antistatic layer is grounded.

In the display device according to the embodiments of the present disclosure, since the antistatic layer surrounds the display region, that is to say, the display region is not covered by the antistatic layer, the problem of the display region having a reduced light transmittance due to being covered by the antistatic layer in the conventional art is avoided, so that the antistatic layer of the present invention will not lead to a reduction of the light transmittance. Also, since the antistatic layer of the present invention is disposed on the cover plate and the cover plate has a size larger than that of a color filter substrate of the display device, an edge of the cover plate has a relatively wide region in which the antistatic layer can be disposed and thus an antistatic layer having a good charge transport performance can be provided, thereby meeting the narrow bezel requirement. The antistatic protection function can be achieved without reducing the light transmittance while meeting the requirement of the narrow bezel display device.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

Figure 1:
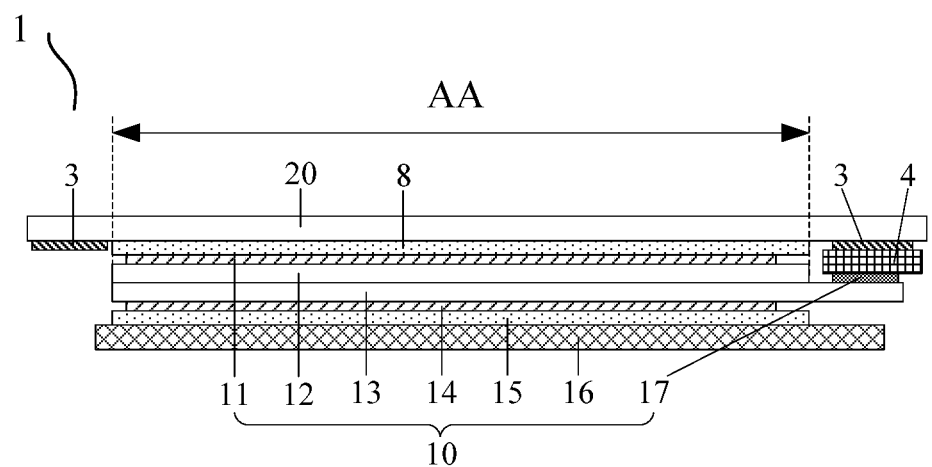
FIG. 1 is an illustrative structural view of a display device according to one embodiment of the present disclosure.

| Reference Numerals | |
| --- | --- |
| 1-display device; | 10-display panel; |
| 11-upper polarizer; | 12-color filter substrate; |
| 13-array substrate; | 14-lower polarizer; |
| 15-double-sided adhesive; | 16-backlight source; |
| 17-grounding pad; | 18-first circuit; |
| 20-cover plate; | 3-antistatic layer; |
| 4-double-sided conductive adhesive; | 5-second circuit; |
| 6-metallic case; | 7-conductive foam; |
| 8-optical adhesive; | AA-display region; |
| BB-bezel region. | |

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 2:
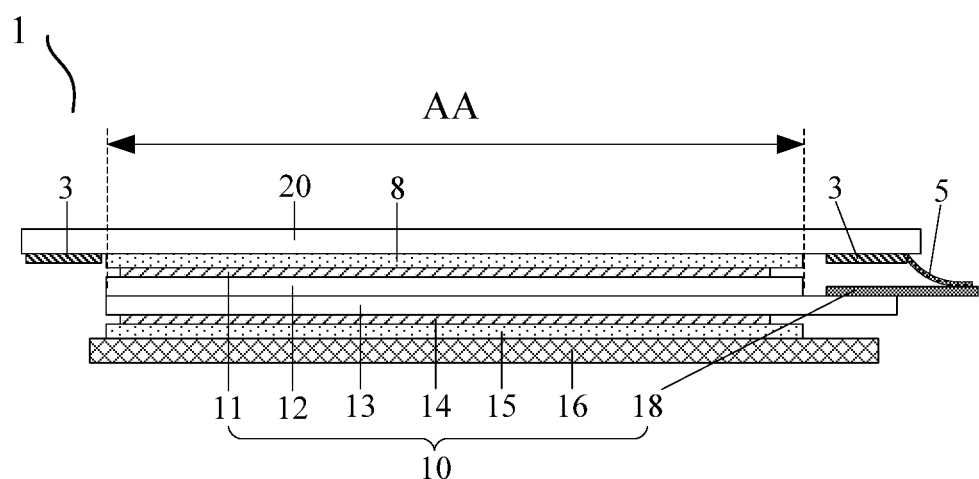
FIG. 2 is an illustrative structural view of a display device according to another embodiment of the present disclosure.
Figure 3:
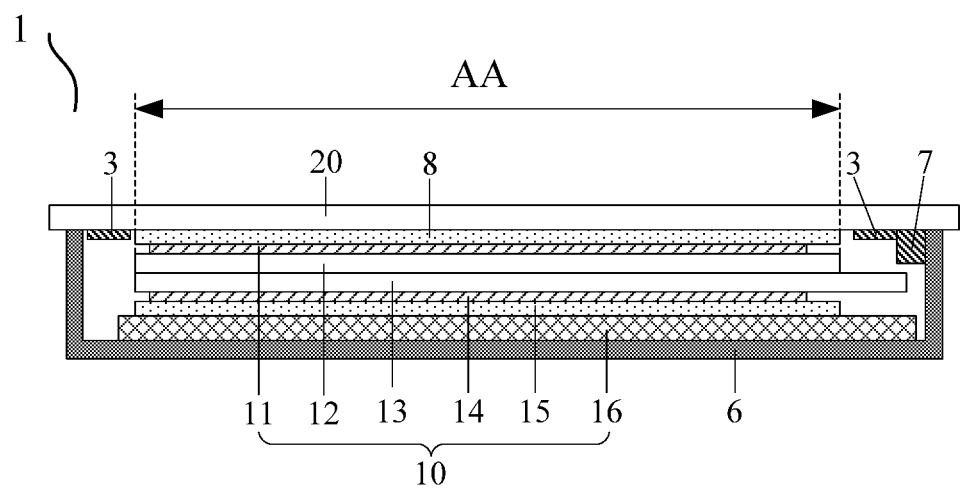
FIG. 3 is an illustrative structural view of a display device according to yet another embodiment of the present disclosure.

At least one embodiment of the present disclosure provides a display device 1. As illustrated in FIG. 1 to FIG. 3, the display device comprises a display panel 10, a cover plate 20 and an antistatic layer 3. The cover plate 20 is stacked with the display panel 10. The antistatic layer 3 is provided on a side of the cover plate 20 facing toward the display panel 10 and surrounds a display region AA of the display device. The antistatic layer 3 is grounded.

In the above-described display device 1, the antistatic layer 3 is grounded so that static electricity generated in the display device 1 can be released through the antistatic layer 3, which avoids the ESD phenomenon of the display device 1. Since the antistatic layer 3 surrounds the display region AA, which means that the display region AA is not covered by the antistatic layer 3, the problem of the display region AA having a reduced light transmittance due to being covered by the antistatic layer is avoided. Also, since the antistatic layer 3 is disposed on the cover plate 20 and the cover plate 20 has a size larger than that of a color filter substrate 12 of the display device, an edge of the cover plate 20 has a relatively wide region in which the antistatic layer 3 can be disposed and thus an antistatic layer 3 having a good charge transport performance can be provided. Therefore, the above-described display device 1 can prevent the EDS phenomenon without reducing the light transmittance while meeting the narrow bezel requirement.

It is to be noted that in the display device 1, since a wiring board is to be bonded to an array substrate 13, the array substrate 13 usually has a size smaller than that of the color filter substrate 12. Further, since the cover plate 20 is required to completely cover the display panel 10, the size of the cover plate 20 is larger than or equal to the size of the array substrate 13. Therefore, the size of the cover plate 20 is larger than that of the color filter substrate 12.

In the antistatic protection of the conventional art in which an antistatic ring surrounding the display region is disposed on the color filter substrate, since a distance between an edge of the color filter substrate and the display region is relatively short, to prevent the antistatic ring from accidently entering the display region during production, a high manufacturing precision of the antistatic ring is required, which results in great difficulty in the manufacture of the antistatic ring. In the display device according to the present embodiment, since the size of the cover plate 20 is relatively large and there is a relatively long distance between the edge of the cover plate 20 and the display region AA, the requirement for the manufacturing precision of the antistatic layer 3 is reduced and thus the difficulty of the manufacturing process of the antistatic layer 3 is reduced.

It is to be added that the configuration of the display device as described in the present embodiment can be as follows. The cover plate 20 is adhered to one side of the display panel 10 by use of optical adhesive 8. The cover plate 20 can be a transparent cover plate. A backlight source 16 is adhered to the other side of the display panel 10 by use of double-sided adhesive 15. The display panel 10 comprises the color filter substrate 12, the array substrate 13, an upper polarizer 11 and a lower polarizer 14. The color filter substrate 12 and the array substrate 13 are oppositely arranged. The upper polarizer 11 is disposed on a side of the color filter substrate 12 facing away from the array substrate 13. The lower polarizer 14 is disposed on a side of the array substrate 13 facing away from the color filter substrate 12. In the present embodiment, the display device having the above-described configuration is taken as an example only, and the configuration of the display device according to the present embodiment is not limited thereto.

Figure 4:
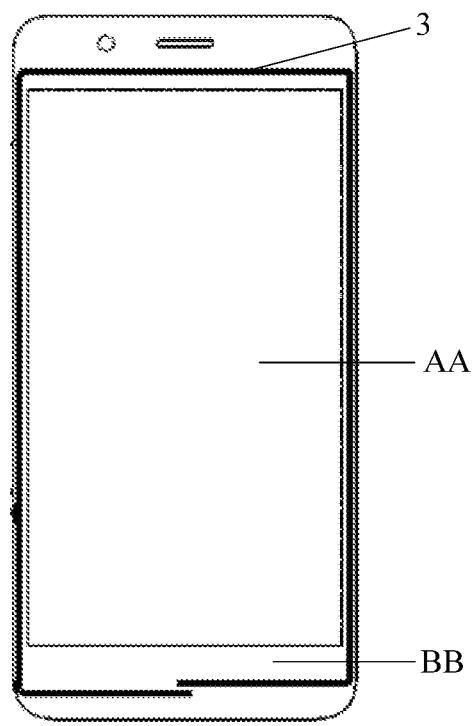
FIG. 4 is an illustrative structural view of an antistatic layer of a display device according to one embodiment of the present disclosure.

As illustrated in FIG. 4, the antistatic layer 3 can be of an annular structure formed by a conductive wiring pattern. The annular structure surrounds the display region AA, so as to release the static electricity generated all over the display region AA. Since the antistatic layer 3 is formed by the conductive wiring pattern having a relatively small line width, the antistatic layer having such a structure is very suitable for the narrow bezel display device or even for the super narrow bezel display device. For example, referring to FIG. 4 again, the antistatic layer 3 formed by the conductive pattern is not closed, so that an interference of a closed coil to signals received by or sent from the display device is prevented. Of course, the antistatic layer 3 formed by the conductive wiring pattern can be closed, which is not restricted by the embodiments of the present disclosure. The aforementioned antistatic layer 3 formed by the conductive wiring pattern can be manufactured by a photoetching process.

Figure 5:
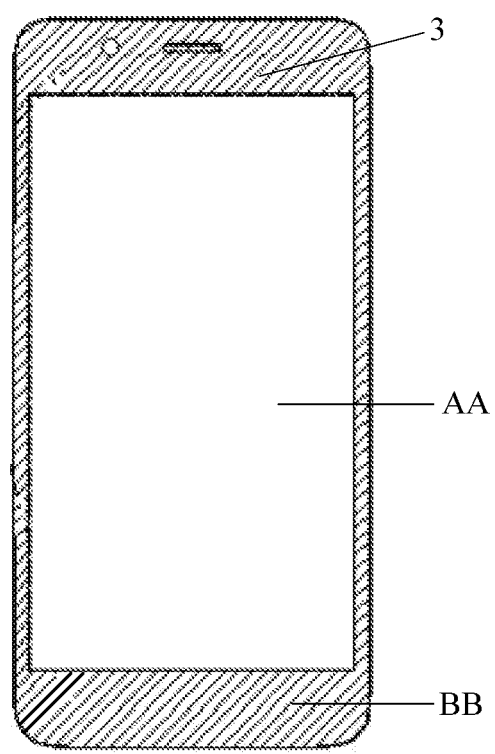
FIG. 5 is an illustrative structural view of an antistatic layer of another display device according to the embodiments of the present disclosure.

As illustrated in FIG. 5, the antistatic layer 3 can be of a planar structure covering a bezel region BB of the display device. The planar structure surrounds the display region AA, so as to release the static electricity generated all over the display region AA. Since the antistatic layer 3 is of a planar structure having a large area, electrostatic charges can be quickly released through the antistatic layer 3. The aforementioned antistatic layer 3 having a planar structure can be manufactured by screen printing or affixing process. It is to be noted that the bezel region BB surrounds the display region AA.

Next, the manner of grounding the antistatic layer 3 will be discussed.

In one embodiment of the present disclosure, as illustrated in FIG. 1, the display panel 10 is provided with a grounding pad 17. The grounding pad 17 can be disposed at periphery of the array substrate 13 of the display panel 10. The antistatic layer 3 and the grounding pad 17 are electrically connected to achieve the grounding of the antistatic layer 3. For example, referring to FIG. 1 again, the antistatic layer 3 and the grounding pad 17 can be bonded by double-sided conductive adhesive therebetween so as to achieve an electrical connection therebetween. Further, the antistatic layer 3 and the grounding pad 17 can be electrically connected to each other by conductive silver paste which can be provided between the antistatic layer 3 and the grounding pad 17 by dispensing process. Of course, the antistatic layer 3 and the grounding pad 17 can be electrically connected to each other by use of other conductive members.

It is to be noted that in the antistatic protection of the conventional art in which an antistatic layer is formed on an upper polarizer or a color filter substrate of the display device, grounding of the antistatic layer is usually achieved by dispensing the conductive silver paste at an edge of the antistatic layer. Since it is not allowed that the conductive silver paste enters the display region and affects the light transmittance of the display region, while a distance between the upper polarizer or the edge of the color filter substrate and the display region is relatively short, a high precision in the process of dispensing the conductive silver paste is required, which results in greater difficulty in the process of grounding the antistatic layer. Unlike the conventional art, in the display device according to the embodiments of the present disclosure, since the distance between the edge of the cover plate 20 and the display region AA is relatively long, there is a relatively large region in which the double-sided conductive adhesive 4 or the conductive silver paste can be provided, so that the precision requirement for providing the double-sided conductive adhesive 4 or the conductive silver paste can be reduced and thus the difficulty in the process of achieving the grounding of the antistatic layer 3 can be reduced as well.

In one embodiment of the present disclosure, as illustrated in FIG. 2, the display panel 10 is electrically connected to a first circuit 18 provided with a grounding terminal thereon. The antistatic layer 3 is electrically connected to a second circuit 5 which is electrically connected with the grounding terminal of the first circuit 18, so as to achieve the grounding of the antistatic layer 3. The first circuit 18 can be bonded to the display panel 10. The second circuit 5 can be directly bonded to the antistatic layer 3. Alternatively, the second circuit 5 can be adhered to the antistatic layer 3 by double-sided conductive adhesive. Since a distance between the edge of the cover plate 20 and the display region AA is relatively long, there is a relatively large region in which the second circuit 5 can be provided. Therefore, compared with the structure of the conventional art in which the antistatic layer is formed on the upper polarizer or the color filter substrate of the display device and the grounding of the antistatic layer is achieved by dispensing the conductive silver paste at the edge of the antistatic layer, the manner of grounding the antistatic layer 3 according to the present embodiment also has an advantage of less difficulty in the process.

In one embodiment of the present disclosure, as illustrated in FIG. 3, the display device 1 further comprises a metallic case 6 for housing the display panel 10. The antistatic layer 3 can be electrically connected with the metallic case 6 directly. Since the metallic case 6 is grounded per se, the antistatic layer 3 is grounded accordingly. Referring to FIG. 3 again, the antistatic layer 3 can be electrically connected with the metallic case 6 through conductive foam 7. Of course, the antistatic layer 3 can be electrically connected with the metallic case 6 through other conductive members such as double-sided conductive adhesive, conductive silver paste and the like.

The antistatic layer 3 according to the embodiments of the present disclosure can be made of any one of copper, molybdenum, aluminum and silver and the like, so that it is ensured that the antistatic layer 3 has a good charge transport performance.

The technical solutions according to the embodiments of the present disclosure can be applied to display devices of liquid crystal type, for example, embedded liquid crystal display devices, such as On-Cell liquid crystal display devices (the touch functional layer is between the substrate and the polarizer), In-cell liquid crystal display devices (the touch functional layer is between the two substrates) and the like. However, it cannot be construed as a limitation of the applicable range of the technical solutions according to the embodiments of the present disclosure. The technical solutions according to the embodiments of the present disclosure can be applied to any other display devices which aim to achieve the antistatic protection function without reducing the light transmittance while meeting the requirement of the narrow bezel display device.

It is to be noted that the display device according to the embodiments of the present disclosure is applicable to any products or components having a display function such as televisions, displays, film screens, cell phones, tablet computers, laptops, digital photo frames, navigators and etc.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510689434.1 filed on Oct. 21, 2015, the disclosure of which is hereby entirely incorporated by reference as a part of the present disclosure.

The invention claimed is:

1. A display device, comprising a display panel and a cover plate stacked with the display panel, wherein an antistatic layer is provided on a side of the cover plate facing toward the display panel, wherein the antistatic layer is in contact with the cover plate and is grounded, an orthogonal projection of the antistatic layer on the cover plate encloses an orthogonal projection of a display region of the display device on the cover plate, and the orthogonal projection of the antistatic layer is not overlapped with the orthogonal projection of the display region.

2. The display device according to claim 1, wherein the antistatic layer is disposed on a bezel region of the display device; or
the antistatic layer is of an annular structure formed by a conductive wiring pattern.

3. The display device according to claim 2, wherein the antistatic layer is configured into a closed structure or an unclosed structure.

4. The display device according to claim 2, wherein a grounding pad is provided on the display panel, and the antistatic layer is electrically connected with the grounding pad.

5. The display device according to claim 2, wherein the display panel is electrically connected to a first circuit which is provided with a grounding terminal thereon, and the antistatic layer is electrically connected to a second circuit which is electrically connected with the grounding terminal of the first circuit.

6. The display device according to claim 1, wherein the antistatic layer is configured into a closed structure or an unclosed structure.

7. The display device according to claim 6, wherein a grounding pad is provided on the display panel, and the antistatic layer is electrically connected with the grounding pad.

8. The display device according to claim 6, wherein the display panel is electrically connected to a first circuit which is provided with a grounding terminal thereon, and the antistatic layer is electrically connected to a second circuit which is electrically connected with the grounding terminal of the first circuit.

9. The display device according to claim 1, wherein a grounding pad is provided on the display panel, and the antistatic layer is electrically connected with the grounding pad.

10. The display device according to claim 9, wherein the antistatic layer and the grounding pad are electrically connected to each other through double-sided conductive adhesive.

11. The display device according to claim 10, wherein the display panel is electrically connected to a first circuit which is provided with a grounding terminal thereon, and the antistatic layer is electrically connected to a second circuit which is electrically connected with the grounding terminal of the first circuit.

12. The display device according to claim 9, wherein the antistatic layer and the grounding pad are electrically connected to each other through conductive silver paste.

13. The display device according to claim 12, wherein the display panel is electrically connected to a first circuit which is provided with a grounding terminal thereon, and the antistatic layer is electrically connected to a second circuit which is electrically connected with the grounding terminal of the first circuit.

14. The display device according to claim 9, wherein the display panel is electrically connected to a first circuit which is provided with a grounding terminal thereon, and the antistatic layer is electrically connected to a second circuit which is electrically connected with the grounding terminal of the first circuit.

15. The display device according to claim 1, wherein the display panel is electrically connected to a first circuit which is provided with a grounding terminal thereon, and the antistatic layer is electrically connected to a second circuit which is electrically connected with the grounding terminal of the first circuit.

16. The display device according to claim 15, wherein the first circuit is electrically connected to the display panel in a binding manner.

17. The display device according to claim 15, wherein the antistatic layer and the second circuit are electrically connected to each other in a binding manner.

18. The display device according to claim 15, wherein the antistatic layer and the second circuit are electrically connected to each other through double-sided conductive adhesive.

19. The display device according to claim 1, wherein the display device further comprises a metallic case for housing the display panel, and the antistatic layer and the metallic case are electrically connected.

20. The display device according to claim 19, wherein the antistatic layer is electrically connected to the metallic case through conductive foam.

* * * * *